United States Patent
Kaczynski (10) Patent No.: US 9,685,964 B1
(45) Date of Patent: Jun. 20, 2017

(54) FAST-LOCKING FREQUENCY SYNTHESIZER

(71) Applicant: Second Sound LLC, Houston, TX (US)

(72) Inventor: Brian James Kaczynski, Krakow (PL)

(73) Assignee: Second Sound LLC, Houston, TX (US)

( * ) Notice: Subject to any disclaimer, the term of this patent is extended or adjusted under 35 U.S.C. 154(b) by 0 days.

(21) Appl. No.: 14/864,886

(22) Filed: Sep. 25, 2015

(51) Int. Cl.
*H03B 21/00* (2006.01)
*H03L 7/099* (2006.01)
*H03L 7/091* (2006.01)

(52) U.S. Cl.
CPC ............ *H03L 7/0992* (2013.01); *H03L 7/091* (2013.01)

(58) Field of Classification Search
CPC ...................................... H03L 7/0992
See application file for complete search history.

(56) References Cited

U.S. PATENT DOCUMENTS

| | | | | |
|---|---|---|---|---|
| 6,788,120 B1 * | 9/2004 | Nguyen | ............... | H03K 5/1565 327/172 |
| 2008/0272810 A1 * | 11/2008 | Edwards | ................ | H03L 7/085 327/156 |

* cited by examiner

*Primary Examiner* — Daniel Puentes
(74) *Attorney, Agent, or Firm* — Julia Kornilova; James Earl Lowe, Jr.

(57) ABSTRACT

Methods and digital circuits providing frequency correction to frequency synthesizers are disclosed. An FLL digital circuit is provided that is configured to handle a reference frequency that is dynamic and ranges over a multi-decade range of frequencies. The FLL circuit includes a digital frequency iteration engine that allows for detection of disappearance of a reference frequency. When the digital frequency iteration engine detects that the reference frequency signal is not available, the oscillator generated frequency is not corrected, and the last value of the oscillator generated frequency is held until the reference frequency signal becomes available again.

14 Claims, 8 Drawing Sheets

FAST-LOCKING FREQUENCY SYNTHESIZER

CROSS REFERENCE TO RELATED U.S. PATENT APPLICATIONS

The present application is related to U.S. patent application entitled SYNCHRONOUS SAMPLING OF ANALOG SIGNALS, filed Sep. 25, 2015, Ser. No. 14/864,899, which is incorporated herein by reference in its entirety for all purposes.

BACKGROUND

The present disclosure relates generally to frequency synthesizers. Frequency synthesizers generate frequencies from one or more fixed reference frequencies, and are found in various devices including musical instruments, GPS systems, mobile telephones, etc.

There are several different types of frequency synthesizers including direct analog synthesizers, direct digital synthesizers, and indirect digital synthesizers. The indirect digital synthesizers based on phase-locked loops ("PLLs") are compatible with integrated circuit technology. The indirect digital PLL synthesizers often include the following components: voltage controlled oscillators, mixers, PLLs, frequency multipliers, and frequency dividers. A voltage-controlled oscillator of a PLL synthesizer typically generates an output frequency from the filtered output of the phase frequency detector. A divider then scales the output frequency. In some applications, a reference frequency is dynamic and can span a multi-decade range of frequency values. In these cases, the traditional PLL synthesizers have drawbacks.

SUMMARY

Implementations of the methods, frequency-locked loop circuits, and frequency synthesizers for providing correction to frequencies are disclosed herein. One implementation is a method for correcting frequencies. The method includes receiving a first frequency generated by an oscillator. The method further includes receiving a reference frequency. The method further includes determining a number of first frequency cycles in one reference frequency cycle. The method further includes receiving a dropout value associated with the reference frequency. The method further includes determining a second frequency based on a predetermined frequency factor, the dropout value, the determined number of first frequency cycles, the first frequency, and the reference frequency. The predetermined frequency factor provides target relationship between the first frequency and the reference frequency.

Another implementation is a frequency-locked loop circuit. The frequency-locked loop circuit includes a digitally controlled oscillator configured to generate a first frequency. The frequency-locked loop circuit further includes a dropout detector configured to receive a reference frequency, and generate a dropout value. The frequency-locked loop circuit further includes a digital frequency iteration engine. The digital frequency iteration engine includes a first circuit configured to receive the first frequency and the reference frequency, and generate a number of first frequency cycles in one reference frequency cycle. The digital frequency iteration engine further includes a second circuit configured to receive the number of first frequency cycles, and generate a second frequency based on a predetermined frequency factor, the dropout value, the determined number of first frequency cycles, the first frequency, and the reference frequency. The predetermined frequency factor provides a target relationship between the first frequency and the reference frequency.

Another implementation is a frequency synthesizer. The frequency synthesizer includes a frequency-locked loop circuit. The frequency-locked loop circuit includes a digitally controlled oscillator configured to generate a first frequency. The frequency-locked loop circuit further includes a dropout detector configured to receive a reference frequency and a first frequency, and generate a dropout value. The frequency-locked loop circuit further includes a digital frequency iteration engine. The digital frequency iteration engine includes a first circuit comprising a Gray-code counter, a Gray-to-binary converter, a first plurality of flip-flops. The first circuit is configured to receive the first frequency and a reference frequency, and generate a number of first frequency cycles in one reference frequency cycle. The digital frequency iteration engine further includes a second circuit comprising a multiplexor, a second plurality of flip-flops, and an estimation module. The second circuit configured to receive the number of first frequency cycles, and generate a second frequency based on a predetermined frequency factor, the dropout value, the determined number of first frequency cycles, the first frequency, and the reference frequency. The predetermined frequency factor provides a target relationship between the first frequency and the reference frequency.

These implementations are mentioned not to limit or define the scope of the disclosure, but to provide an example of an implementation of the disclosure to aid in understanding thereof. Particular implementations may be developed to realize one or more of the following advantages.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Like reference numbers and designations in the various drawings indicate like elements.

DETAILED DESCRIPTION

Numerous specific details may be set forth below to provide a thorough understanding of concepts underlying the described implementations. It may be apparent, however, to one skilled in the art that the described implementations may be practiced without some or all of these specific details. In other instances, some process steps have not been described in detail in order to avoid unnecessarily obscuring the underlying concept.

In certain disciplines such as electronic music, a frequency may be desired that exhibits a certain ratio relationship to another frequency such as a reference frequency. Aesthetically pleasing results can be obtained if the generated frequency corresponds to a rational multiple R=N/D of the reference frequency, where N (the numerator) and D (the denominator) are both integers. Such a configuration may be used in many other disciplines (e.g., data communication systems, etc.) other than electronic music and the embodiments disclosed herein are in no way intended to be restricted to the realm of electronic music.

In any discipline where the reference frequency is dynamic (i.e., changing in time) and can span over a multi-decade range, traditional phase-locked loop ("PLL") systems have many drawbacks. The multi-decade range of the reference frequency may mean several decades, or factors of 10. Electronic music is an example discipline for which the reference frequency is dynamic and spans a multi-decade range.

As used herein, "phase-locked" refers to a PLL system forcing the instantaneous phase of the output signal to "line up" with the instantaneous phase of the input signal. While second-order PLLs have some desirable noise properties, they may function by integrating the phase error between the reference signal and the feedback signal from one reference cycle to the next and adjusting the frequency of the output signal until the phase error is driven to zero. If there is an extremely large phase error at any time, it may take the second-order PLL an especially long time to lock or it may "slew" or behave non-linearly during locking. Thus, the second-order PLLs can also be problematic in applications where the reference frequency changes dynamically and over a multi-decade frequency range.

Although these effects (e.g., the "locking" effect) can be exploited as a pleasing side-effect in electronic music, it may be desirable to mitigate these effects and thereby minimize the locking time. In the context of electronic music, latency may be important for effects, which must function in real-time. The reference signal and the oscillator generated signal may operate at different frequencies, and in particular in electronic music, the frequency relationships are not expressed in terms of a "relative phase" between the two signals, but rather as harmonies or dissonances.

When the "locking" of a synthesized frequency to another frequency is not meant to be experienced as an additional effect, but rather is meant to be imperceptibly fast, traditional PLLs do not satisfy this need. Another drawback of traditional frequency synthesizers (both PLLs and FLLs) is that if the reference signal disappears, the synthesizer output may not necessarily behave "well" as the frequency could drift to the maximum frequency or minimum frequency allowed by the system.

According to various implementations disclosed herein, a frequency-locked loop ("FLL") system is provided. The FLL system utilizes a digital, rather than analog approach, and the FLL system does not perform phase locking. In some embodiments, the FLL system is configured to detect when the reference signal has disappeared. When the FLL system detects that the reference signal disappeared, it may suspend the loop operation and "hold" the current digital frequency "code".

Figure 1:
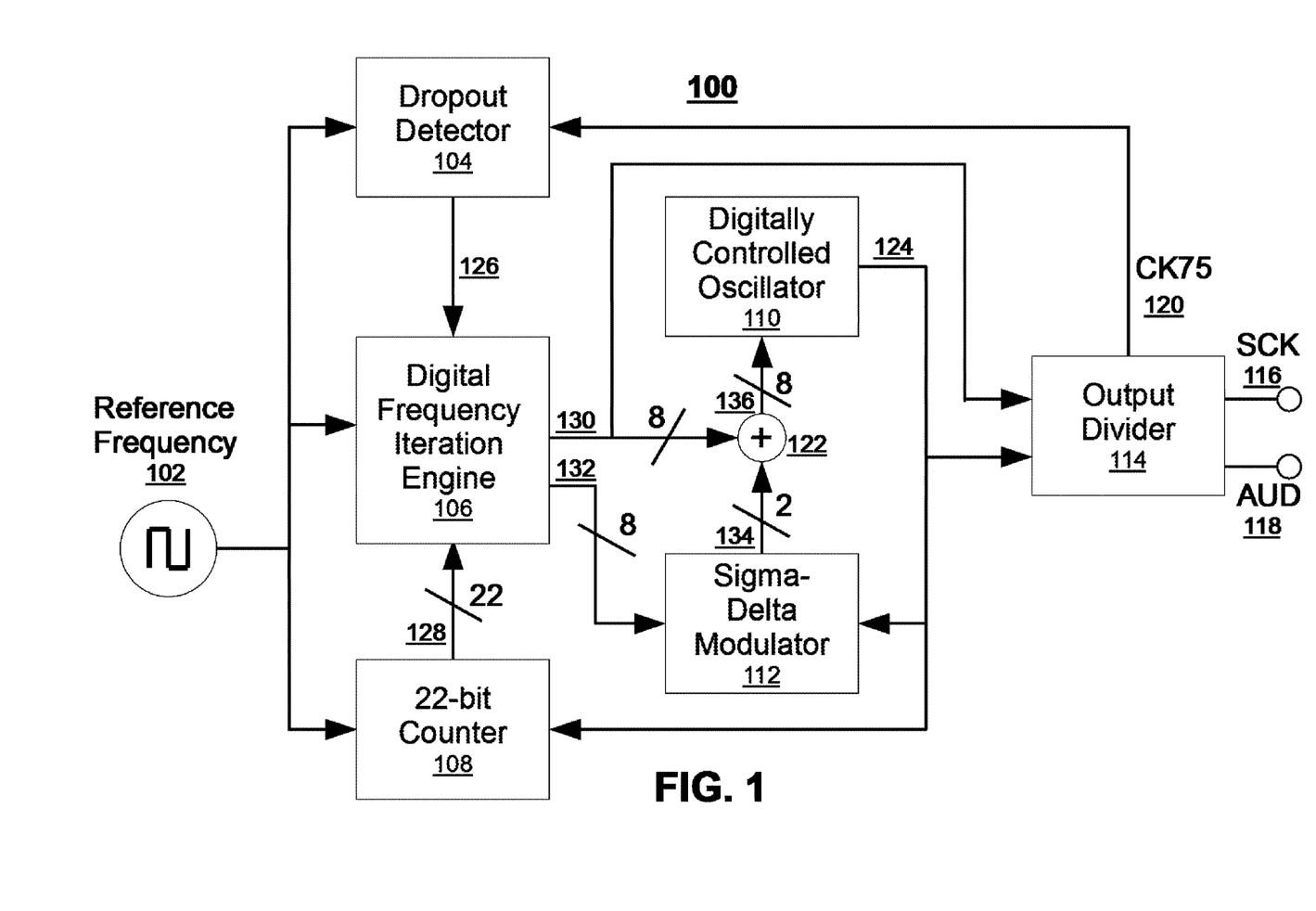
FIG. 1 is a block diagram of a frequency-locked loop system, in an accordance with a described implementation.

Referring to FIG. 1, a block diagram of a FLL system 100, in accordance with a described implementation, is shown. The block diagram of the frequency-locked loop system 100 illustrates the schematic of the overall architecture of the digital FLL circuit. As shown, the frequency-locked loop system 100 includes a dropout detector 104, a digital frequency iteration engine 106, a 22-bit counter 108, a digitally controlled oscillator ("DCO") 110, a sigma-delta modulator 112, and an output divider 114. In some implementations, these components may be integrated into a chip (e.g., used in a music synthesizer). The FLL system 100 may include additional components that are not displayed in FIG. 1.

The dropout detector 104, the digital frequency iteration engine 106, and the 22-bit counter 108, each receive a reference signal 102. The reference signal 102 may be generated by an oscillator that is not illustrated in FIG. 1 (e.g., an oscillator distinct from the DCO 110). The frequency of the reference signal 102 may be dynamic and may change over a multi-decade frequency range.

Figure 2:
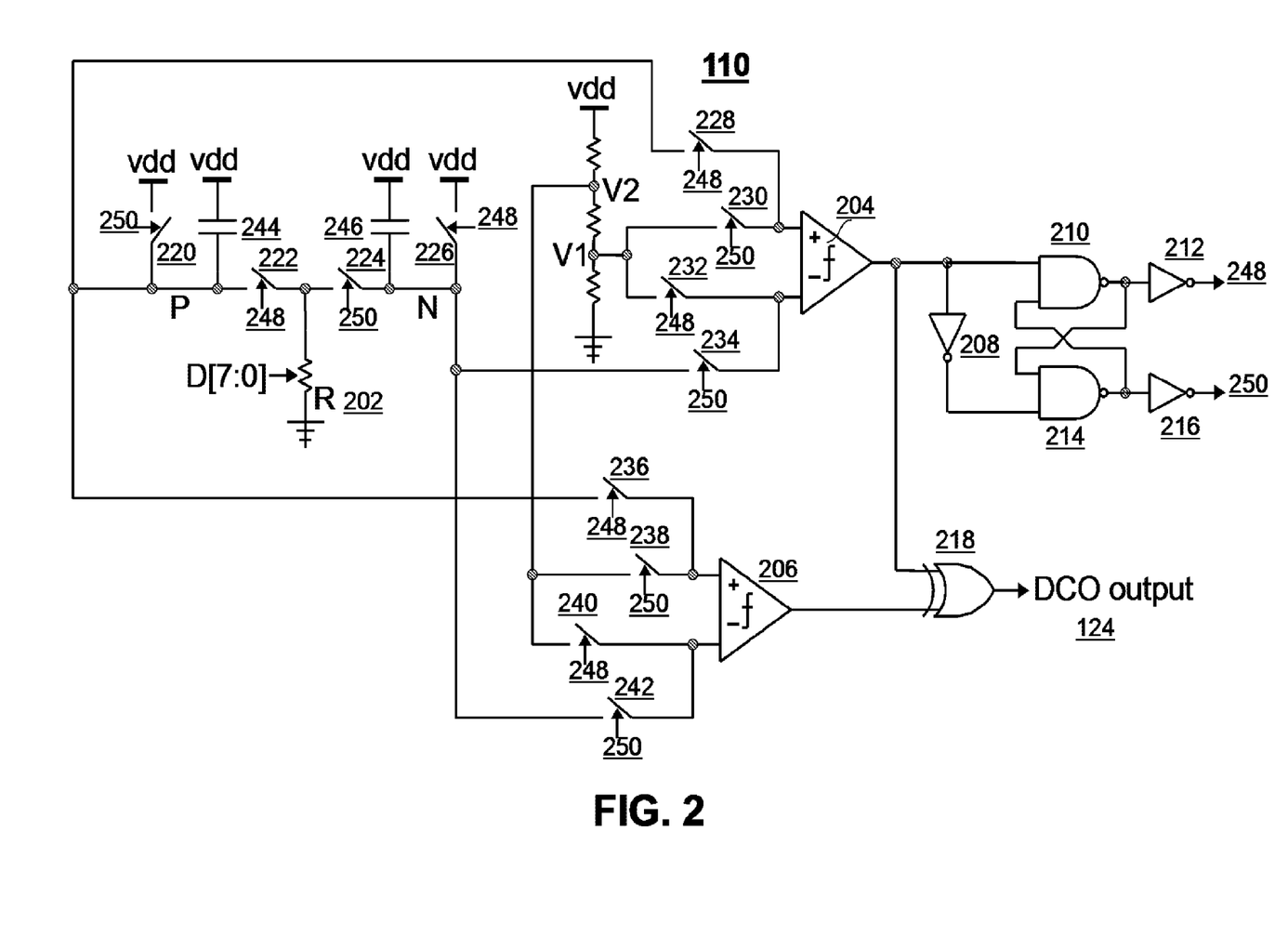
FIG. 2 is a diagram of a digitally controlled oscillator, in an accordance with a described implementation.

The DCO 110 generates a DCO output signal 124, which is transmitted to the output divider 114, the sigma-delta modulator 112, and the 22-bit counter 108. One implementation of the DCO 110 is illustrated in FIG. 2. However, the DCO 110 may be designed in any other manner, and FIG. 2 provides one implementation.

The 22-bit counter 108 measures elapsed time by counting cycles of the digitally controlled oscillator 110. The output 128 of the 22-bit counter 108 is sent to the digital frequency iteration engine 106, which uses the output 128 to generate an estimate of the frequency. The digital frequency iteration engine 106 makes corrections that then go back to the digitally controlled oscillator 110 to change its frequency 124, so that it reaches a predetermined target.

The sigma-delta modulator 112 is a digital signal modulator that receives 8-bit digital output 132, representing the fractional part of the desired DCO frequency, from the digital frequency iteration engine 106, and the DCO output 124 from the DCO 110. The sigma-delta modulator 112 is a state machine that changes state on every DCO clock cycle, and produces a 2-bit output 134 that is transmitted to an adder block 122.

The output divider 114 receives the DCO output 124 and the output 130, and generates CK75 signal 120, SCK signal 116, and AUD signal 118. The CK75 signal 120 is passed to the dropout detector 104, which also receives the reference frequency 102 as input. The dropout detector 104 determines whether the reference frequency 102 has dropped out. The output 126 of the dropout detector 104 is sent to the digital frequency iteration engine 106.

The adder block 122 adds the 8-bit output 130, representing the integer part of the desired DCO frequency and generated by the digital frequency iteration engine 106, to the 2-bit output 134 of the sigma-delta modulator 112, generating an 8-bit output 136 that is transmitted to the digitally controlled oscillator 110.

In other implementations, a digital FLL or PLL system can be designed using another method. For example, a linear feedback loop may be utilized, which may have a different settling behavior than the logarithmic loop utilized herein.

FIG. 2 illustrates an exemplary schematic of the DCO 110, in accordance with one implementation. The DCO 110 receives digital input. In some embodiments, in order to achieve a multi-decade frequency range, a resistor-capacitor (RC) based relaxation oscillator may be utilized, where the resistor is tuned digitally over an eight-octave range (i.e., a factor of 256). In other embodiments, the FLL system 100 can utilize a DCO with another frequency tracking range. For example, the frequency tracking range can be extended.

As shown in FIG. 2, the DCO 110 includes a digitally-programmable resistor network, a two "bridge" network of four switches each, two capacitors, two voltage comparators, two reference voltages (which can be generated by dividing the supply voltage of the DCO using resistor-based voltage dividers), and digital logic.

A resistor 202 is connected with one terminal grounded, and the other terminal connected to switches 222 and 224. The second terminal of the switch 222 is connected to a capacitor 244 at a node "P," while the second terminal of the switch 224 is connected to a capacitor 246 at a node "N." The switches 220 and 226 are connected between capacitors 244 and 246, respectively, and the power supply.

The nodes "P" and "N" are connected via switches 228 and 234, respectively, to the positive and negative inputs of a voltage comparator 204. Additionally, a reference voltage V1 is connected via switches 230 and 232 to the positive and negative inputs, respectively, of the voltage comparator 204. The output of the voltage comparator 204 is used to generate two non-overlapping normal and delayed clocks, which are in turn used to control the eight switches 220 through 234. In some embodiments, the voltage comparator 204 can be designed to include one or more resistors, and an operational amplifier.

In some embodiments, the RC-based relaxation oscillator 110 has two phases of operation: a first phase and a second phase. During the first phase of operation of the DCO 110, the switches 222 and 226 are closed and the switches 220 and 224 are opened. The capacitor 246 is shorted out to the supply and the programmable resistor 202 proceeds to discharge the capacitor 244 from the supply towards ground. Voltage "P" during this phase exhibits the decaying exponential shape with time constant (resistor 202)*(capacitor 244). The switch 228 connects the node "P" to the positive comparator input and the switch 232 connects the reference voltage V1 to the negative comparator output. The comparator output remains high until the voltage at node "P" crosses the reference voltage V1 in the negative-going direction. At this point, the comparator output is driven low, and the operation of the DCO 110 transfers to the second phase.

During the second phase, the switches 222 and 226 are opened and the switches 220 and 224 are closed. Voltage "N" starts out at the supply and decays towards ground with time constant (resistor 202)*(capacitor 246) via the resistor 202, the capacitor 246, and the switch 222. The capacitor 244 is shorted out to the supply to prepare for the next first phase. The switches 228 through 234 also reverse roles and the comparator changes state again when voltage "N" crosses the reference voltage V1. As a result, a relaxation oscillator is achieved with period (resistor 202)*(capacitor 244)+(resistor 202)*(capacitor 246). In some embodiments, the capacitors 244 and 246 may be identical so that the two phases will last equally long.

A voltage comparator 206 and an XOR gate 218 may be utilized to "double" the DCO 110 frequency. The decaying exponential waveforms at nodes "P" and "N" are compared via the voltage comparator 206 to a second reference voltage V2 (which may be appropriately chosen but necessarily higher than V1) through a bridge switch network composed of the switches 236-242, which functions the same way as the bridge switch network composed of the switches 228-234. The logic gates 208-216 after the voltage comparator 204 ensure that the switch control signals 248 and 250 are non-overlapping.

In some embodiments, the resistor 202 may be controlled by 8 bits. In other embodiments, the resistor 202 may be controlled by another number of bits (e.g., 16 bits). The resistor 202 may have an inverse exponential characteristic with respect to the 8-bit control word, which can be expressed by the following formula: $R=R0*2^{-D/32}$ (referred to as "Equation 1" herein), where R0 is the maximum resistance (corresponding to minimum DCO operating frequency) and D is the 8-bit DCO control word. According to this formula, the DCO has 32 steps per octave and may cover 8 octaves over its entire range using an 8-bit control word (5 bits per octave with 3 MSBs to cover 8 octaves).

The resistor 202 can be constructed in many ways. In one embodiment, unit resistor cells may be used in series and parallel combinations to give incremental conductances on each code step which yield the characteristic in Equation 1.

The inverse exponential characteristic of the resistor 202 may yield an exponential characteristic for the DCO frequency 124 itself. Assuming that the capacitance of the capacitor 244 equals the capacitance of the capacitor 246 and ignoring comparator delay, the DCO frequency can be expressed as follows: $Fdco=Fmin*2^{D/32}$ (referred to as "Equation 2" herein), where Fmin is the minimum DCO frequency and D is the 8-bit DCO control word.

While FIG. 2 illustrates one way of designing the DCO 110, the DCO 110 can be designed in another manner and the FLL system 100 is not limited to the embodiment shown in FIG. 2.

Figure 3:
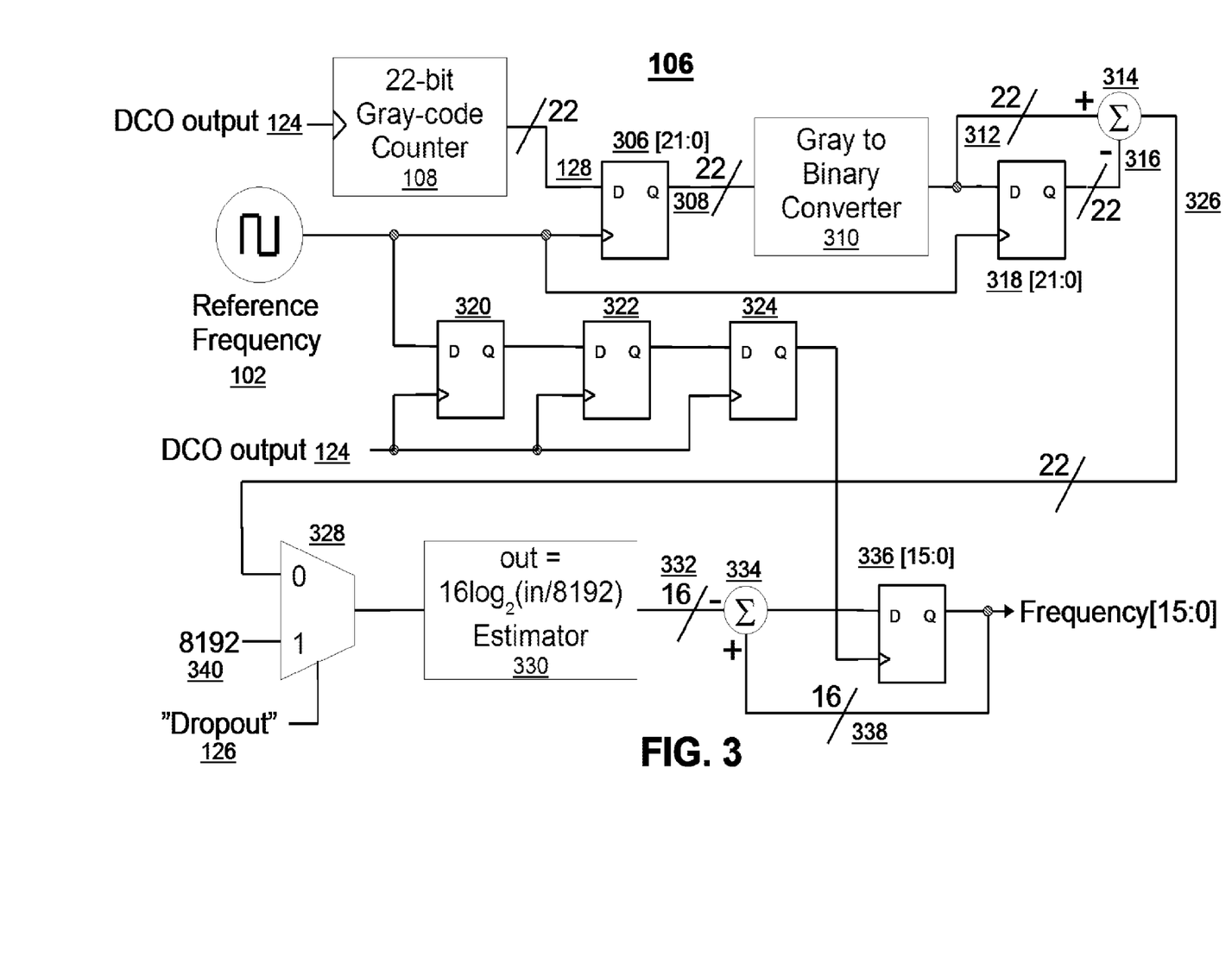
FIG. 3 is a block diagram of a digital frequency iteration engine, in an accordance with a described implementation.

FIG. 3 illustrates a block diagram of the digital "frequency-iteration" engine 106. The digital frequency iteration engine 106 generates a 16-bit frequency 344, of which the 8 most significant bits represent the integer part of the desired frequency control word and the 8 least significant bits represent the fractional part, using the DCO output 124 received from the DCO 110 and the reference frequency 102. In some embodiments, the digital frequency iteration engine 106 may depend on a relationship between the frequency 124 generated by the DCO 110 and the reference frequency 102.

As shown, the digital frequency iteration engine 106 includes a bank of flip-fops 306, 318, 320, 322, 324, and 336, a Gray to binary converter 310, a subtractor block 314, a multiplexor 328, an estimator block 330, and a subtractor block 334. In other embodiments, the digital frequency iteration engine 106 may include other components (e.g., flip-flops, counters, multiplexors, adders, subtractors, etc.). In other embodiments, the digital frequency iteration engine 106 may include a subset of the components displayed in FIG. 3.

In some embodiments, the 22-bit Gray-code counter 108, the D flip-flops 306, the Gray to binary converter 310, and a differentiator, composed of the D flip-flops 318, and the subtractor block 314, measure the number of digitally controlled oscillator 110 cycles that occur between successive reference clock edges. Therefore, the output 326 provides a measurement of the frequency error between the DCO output 124 and the reference frequency 102.

The 22-bit Gray-code counter 108 receives the DCO output 124 generated by the digitally controlled oscillator 110. In some embodiments, the 22-bit Gray-code counter 108 counts on the edges of the DCO output 124 clock. The 22-bit Gray-code counter 108 saves the count as a 22-bit state.

The 22-bit Gray-code counter 108 is a Gray-code counter, with one bit changing on each state transition. In some embodiments, the 22-bit Gray-code counter 108 may be implemented as a component of the digital frequency iteration engine 106. In these embodiments, FIG. 1 would not include the 22-bit Gray-code counter 108, and the digital frequency iteration engine 106 would receive the DCO output 124.

As the reference clock is asynchronous with the DCO clock, the illustrated Gray-code embodiment of the free-running counter 108 may reliably latch the state of the 22-bit counter 108. Although a traditional binary counter may be utilized, the traditional binary counter may not be able to reliably latch the state of the counter.

The 22-bit output 128 generated by the 22-bit Gray-code counter 108 is received as input by the bank of flip-flops 306. As shown, the reference frequency 102 is the clock for the flip-flops 306. The input into the bank of flip-flops 306 changes on every cycle of the digitally controlled oscillator 110. The bank of flip-flops 306 takes a snapshot of the 22-bit word 128 on every edge of the reference frequency 102.

As shown, the output 128 of the Gray-code counter 108 is 22 bits, which is latched with the bank of 22 D flip-flops 306. In other embodiments, the Gray-code counter 108 may produce an output having another number of bits (e.g., 16 bits, 32 bits, etc.), in which case, the bank of flip-flops 306 would have a corresponding number of flip-flops. For example, the Gray-code counter 108 may produce an output 128 having 16 bits, and the bank of flip-flops 306 would have 16 flip-flops to latch the counter state. In another example, the Gray-code counter 108 may produce an output 128 having 32 bits, in which case the bank of flip-flops 306 would have 32 flip-flops to latch the counter state.

The Gray to binary converter 310 receives the 22-bit Gray-code word 308 from the bank of flip-flops 306, and converts the 22-bit Gray-code word 308 to the equivalent 22-bit binary value 312. The 22-bit binary output 312 of the Gray to binary converter 310 provides a measurement of the time, thereby providing a number of DCO 110 cycles that have elapsed.

The bank of flip-flops 318 receives the 22-bit binary output 312 as input, and the reference frequency 102 is the clock. The bank of flips-flops 318 includes 22 D flip-flops. The bank of flip-flops 318 takes a snapshot of the 22-bit word 312 on every edge of the reference frequency 102. As a result, the bank of flip-flops 318 provides a delay by another cycle of the reference frequency 102.

The number of flip-flops in the bank 318 may correspond to the number of bits in the computation (i.e., in this case, 22 flips-flops in the bank of flips-flops 318). In other embodiments, the system can be designed with fewer or more bits, which would be directly reflected in the number of flip-flops in the bank of flip-flops 318. For example, the output 128 of Gray-code counter 108 may be 16 bits, in which case the output 312 of the Gray-to-binary converter counter 108 may be 16 bits, and the bank of flip-flops 318 would include 16 flip-flops. In another example, the output 128 of Gray-code counter 108 may be 32 bits, in which case the output 312 of the Gray-to-binary converter counter 108 may be 32 bits, and the bank of flip-flops 318 would include 32 flip-flops.

The subtractor block 314 receives the current value of the count 312 and the last value of the count 316 when the last reference frequency 102 edge occurred. The subtractor block 314 determines the difference between the values 312 and 316. The difference between the values 312 and 316 is an output 326, which is a measurement of a number of DCO cycles in one reference frequency cycle (i.e., between two reference frequency edges). In some embodiments, the target may be to make that number a certain predetermined number. The rest of the block diagram shown in FIG. 3 illustrates reaching that target.

As shown in FIG. 3, the predetermined target number is set to 8,192. In some embodiments, musical sources are used for the reference frequency. For example, the range of the piano keyboard can be utilized as a target for the frequency tracking range. The frequencies of the standard piano keyboard may range from 27.5 Hz to 4,186 Hz. 8,192 times 27.5 Hz equals 225.28 kHz. The DCO output 124 is divided by a power of two, which is at least 2 to generate a sample clock for the audio signal. As a result, 225.28 kHz divided by 2 produces 112.64 kHz. The synchronous sampling frequency may be between 100 kHz and 200 kHz, and 112.64 kHz is within that range. 8,192 is a power of two (i.e., $2^{13}$), which is convenient to work with in digital circuits. On the high end, 8,192 times 4,186 Hz equals 34.29 MHz. It may be challenging to design the DCO 110 to run higher than about 40 MHz without having to account for the comparator delay. The equation used herein for the DCO frequency versus the resistor code assumes ignoring comparator delay, which is possible when the period of oscillation is large compared to the comparator delay (i.e., when the frequency of oscillation is "low," which for this oscillator means less than 40 MHz). Accordingly, the target number of 8,192 is one implementation for the design of the digital frequency iteration engine 106 illustrated in FIG. 3.

Although the predetermined target number utilized in FIG. 3 is 8,192, another number may be used as the target. It may be desirable to set the multiplication factor to a high value, since generating a higher frequency and dividing it down may result in a "cleaner" signal (i.e., less timing jitter) than generating the lower-frequency signal directly.

The digital "frequency-iteration" engine 106 further includes a "dropout" control multiplexer 328, a base-2 log estimator 330, a subtractor block 334, and flip-flops 336. The base-2 log estimator 330 is a piecewise-linear logarithm calculation circuit, which estimates the value of 16 $\log_2$ (N/8192). The subtractor block 334 subtracts the output 332 of the logarithm estimator block 330 from the current digital frequency code 338, latched in D flip-flops 336. As a result, a new frequency code 344 is generated.

The flip-flops 320, 322, and 324 delay the positive edge of the reference clock 102 by up to three DCO cycles and use this delayed reference clock edge to latch the new 16-bit frequency word 344. In some embodiments, three DCO cycles may be used as this number of DCO cycles may provide all the digital circuits between the 22-bit Gray-code counter 108 and the frequency word flip-flops 336 time to settle completely, so there would be no errors in the latching of the 16-bit frequency word. Usage of three DCO cycles may be specific to the fabrication process selected for the design (e.g., 0.35 um). In other embodiments, another number of DCO cycles (e.g., two DCO cycles, one DCO cycle, etc.) may be utilized (e.g., with other processes that may allow for a shorter delay).

The multiplexor 328 is a 2-to-1 multiplexor that receives two inputs: the subtractor output 326 and an input 340. As shown in FIG. 3, the input 340 has a value of 8,192. The selector input for the multiplexor 328 is a dropout 126, which is received from the dropout detector 104. In some embodiments, the dropout 126 having a value of "1" may indicate that there is no signal, in which case the output 346 of the multiplexor 328 would have a value of 8,192. As a result, the base-2 log estimator block 330 would receive an input value of 8,192. In this instance, passing the value of 8,192 to the base-2 log estimator block 330 causes the circuit 300 to determine that the DCO 110 is perfectly locked since the value 8,192 is the target for that other input into the multiplexor 228. Thus, if there is no signal, the current value of the DCO frequency is maintained. As a result, the circuit 100 is locked, and no corrections are made to the DCO frequency.

If there is a reference frequency signal and the dropout 126 is low, the output 326 of the subtractor 314 is passed to the estimator block 330. The estimator block 330 estimates 16 $\log_2$ (in/8192), where "in" is the output 346 of the multiplexor 328. When the input (i.e., the output 346) to the estimator block 330 equals 8,192, the log is zero, in which case the DCO frequency doesn't get changed. The estimator 330 can perform (in/8192) calculation using digital shift operation (i.e., because 8192 is power of 2, the decimal point is moved in the binary number). The base-2 log estimator block 330 provides an estimate 332 by calculating $\log_2$. This estimate 332 may be not an exact calculation.

In other embodiments, another factor may be utilized by the $\log_2$ estimator 330. In one example, the factor "32" in the $\log_2$ estimator 330 can be used to give a tradeoff between FLL settling time and filtering of noise from timing jitter in the reference frequency. In this example, the frequency may be tracked immediately in a single reference cycle.

The output of a bank of flip flops 336 is 16-bit frequency 344. The frequency 344 is sent into the input 338 of the subtractor block 334, and the output 332 of the estimator 330 is subtracted from the frequency 344 on every cycle, resulting in a new value for the frequency 344. The new value for the frequency 344 is the D input into the bank of flip-flops 336, and this new value is updated on every reference frequency cycle to get the frequency closer to the target.

In one embodiment, the target DCO frequency is 8,192 times faster than the reference frequency. In other embodiments, a different multiplication factor can be utilized (e.g., 2,048). The counter may need to have enough bits so that when the DCO 110 is running at its maximum frequency and the input signal is at the minimum allowed frequency, the current and last counter values yield the number of elapsed cycles without ambiguity (i.e., the counter must not repeat any states between two successive reference clock edges). Although a 22-bit counter is utilized in FIG. 3, a different number of bits may be used (e.g., 16 bits, 32 bits, etc.).

Figure 4:
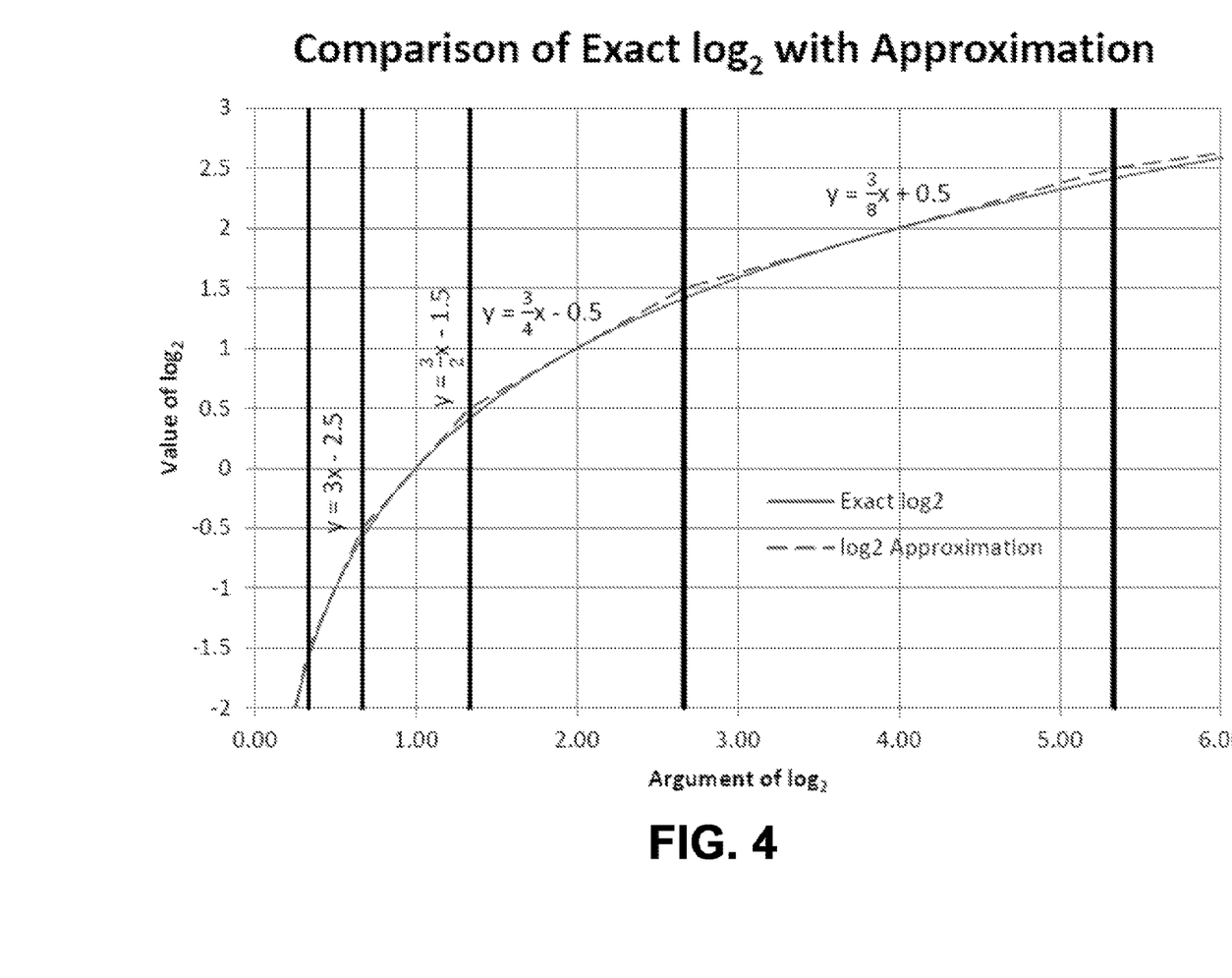
FIG. 4 is an illustration of $\log_2$ approximation, in an accordance with a described implementation.

In the estimator block 330, the base-2 logarithm is estimated by a piecewise linear fit, of which one embodiment is shown graphically in FIG. 4. In some embodiments, first, the piecewise linear fit may be constructed by creating breakpoints at all points on the x-axis corresponding to $(2/3)*2^n$, where n is an integer. Second, on the interval $x\in((2/3)*2^n, (2/3)*2^{n+1})$ a line may be created, which passes through $(x,y)=(2^n,n)$ with slope equal to $1.5*2^{-n}$. In this embodiment, n=0 corresponds to the line passing through (1,0), n=1 corresponds to the line passing through (2,1), and so forth. The equation for the line to the right of breakpoint "n" is: $y=1.5*2^{-n}*x+n-1.5$ (referred to as "Equation 3" herein), and, therefore, the left and right breakpoints can intersect at coordinates: $(x,y)=((2/3)*2^n, n-0.5)$ and $((2/3)*2^{n+1}, n+0.5)$. As a result, the curve is continuous over the range of the base-2 logarithm and passes through all the points whose y-coordinates are integers.

This approach may yield an estimation for the base-2 logarithm, which may be in error by a predetermined accuracy (e.g., at most 8.5% accuracy). In some embodiments, to create the breakpoints, the integer input may be multiplied by 3 (e.g., by performing a binary addition of the input with a left-shifted version of itself), and the most significant bit which is not set to zero may be identified in the result (e.g., using operation known as a "leading one detector"). This works because numbers of the form $(2/3)*2^n$, when multiplied by 3, result in exact powers of 2. The multiply-by-3 may be used directly in the family of lines described in the Equation 3 (e.g., where a multiply by 1.5 is a multiply by 3 followed by a right shift) and all other operations are simple shifts and additions.

This iterative frequency lock process can be understood as follows. First, a frequency error dF is assumed. The desired frequency is (8,192*Fref), and the actual DCO frequency is 8,192*Fref+dF. The 22-bit Gray-code counter 108 will count (8,192*Fref+dF)/Fref=8,192+dF/Fref cycles. The logarithm estimator 330 will output 16 $\log_2[1+dF/(8,192*Fref)]$.

The DCO 110 has an exponential frequency characteristic expressed by $Fdco=Fmin*2^{(D/32)}$. If the desired frequency is 8,192*Fref, the desired digital code will satisfy the following equations: $8,192*Fref=Fmin*2^{(D/32)}$ (referred to as "Equation 4" herein), and $D=32 \log_2 (8192*Fref/Fmin)$ (referred to as "Equation 5" herein). The actual DCO frequency with the error dF may imply the following digital code: $D_{err}=32 \log_2[(8,192*Fref+dF)/Fmin]$ (referred to as "Equation 6" herein). Then, $(D_{err}-D)$ may be calculated in accordance with the following equation: $D_{err}-D=32 \log_2[1+dF/(8,192*Fref)]$ (referred to as "Equation 7" herein).

The Equation 7 may give exactly twice the correction proposed above of 16 $\log_2[1+dF/(8,192*Fref)]$. The correction may be deliberately attenuated to allow the algorithm to filter some jitter noise, which may be present in the reference signal 102. In one implementation, a factor of two may be chosen to optimize both tracking speed and noise filtering. More attenuation of the digital word correction factor would cause the algorithm to settle more slowly, but would filter more noise. The full correction value of 32 $\log_2[1+dF/(8,192*Fref)]$ may be used for music applications as it results in immediate frequency tracking within one cycle of the input signal. In other embodiments, the tradeoff between settling speed and filtering may be optimized differently.

The output of the digital frequency iteration engine 106 may contain any number of fractional bits. As shown in FIG. 3, 8 fractional bits are retained and utilized to drive the second-order sigma-delta modulator 112, which generates a sequence of digital frequency words $D_0$, $D_1$, $D_2$ through $D_{255}$. In some embodiments, the output of the 8-bit sigma-delta modulator 112 may be periodic with a period of at most 256 cycles. The "average" frequency of DCO 110 operation can be specified with 8 extra bits of accuracy beyond the existing 5 bits per octave. As a result, the frequency granularity may be 13 bits per octave, 8,192 tones per octave, or almost 7 tones per musical cent (1 cent is 1/100 of a half step). Because this frequency granularity is so fine, the steps may be imperceptible and the FLL system 100 can track any given frequency on the continuum between the minimum and maximum operating frequencies.

Figure 5:
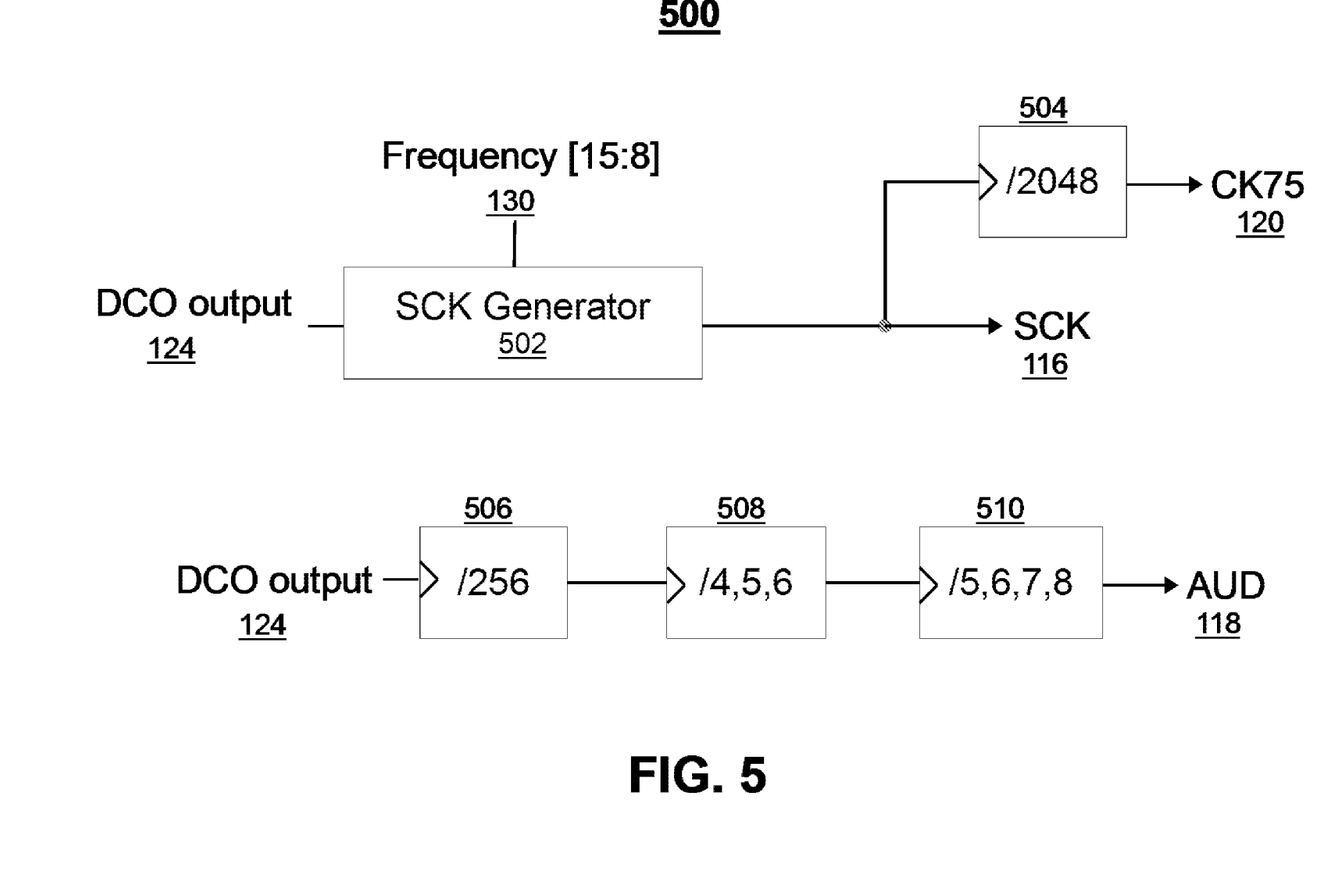
FIG. 5 is a diagram of an output divider, in an accordance with a described implementation.

FIG. 5 illustrates an adaptive circuit 500 of the programmable divider 114. As shown, the divider 114 receives the DCO output 124 and the frequency 130 as input, and generates output signals CK75 120 and SCK 116. In various embodiments, to generate the SCK clock 116, the divider 114 divides the DCO output 124 by a certain number (e.g., by 2), a number of times that would keep it in a tighter range. Since the integer part of the desired DCO frequency 130 is known, the DCO clock down can be divided by a variable power of two which is a function of the integer part of the DCO frequency 130 such that frequency of the resulting output SCK 116 remains within a tighter range than that of the DCO itself (e.g., 100-200 kHz). The SCK 116 clock is then divided (e.g., by 2048), producing the output CK75 120.

As shown in FIG. 5, the circuit 500 of the programmable divider 114 includes an SCK generator 502 and a divide-by-2048 block 504. The SCK generator 502 is an adaptive sample clock generator, which receives the DCO output 124 and frequency 130 as an input, and generates the SCK signal 116. The frequency 130 is the integer part of the desired DCO frequency. The DCO output 124 may vary over a multi-decade range (e.g., 256 to 1 range from maximum to minimum frequency). The SCK clock 116 may be within a tighter range (e.g., the SCK clock 116 varies in 2 to 1 range instead of 256 to 1 range of the DCO output 124) than the DCO output 124 range.

The programmable divider 114 includes a divide-by-2048 counter 504, which converts the SCK signal 116 into the signal CK75 120. The output signal CK75 120 is a clock that varies between 50 Hz and 100 Hz.

In some embodiments, the programmable divider 114 may further include a divide-by-256 counter 506, and a programmable divider with two stages, with one stage dividing by 4, 5, or 6, and the other stage dividing by 5, 6, 7, or 8. The counter 506 is a divide-by-256 counter, which operates on the DCO output 124. By selecting certain combinations of 4, 5, or 6 and 5, 6, 7, or 8, the divider can create harmonies with the original reference input. For example, if the first divider 508 is dividing by 4, and the second divider 510 is dividing by 8, the output will be in unison with the reference signal. In some embodiments, the programmable divider 114 does not include the counters 506, 508, and 510.

Figure 6A:
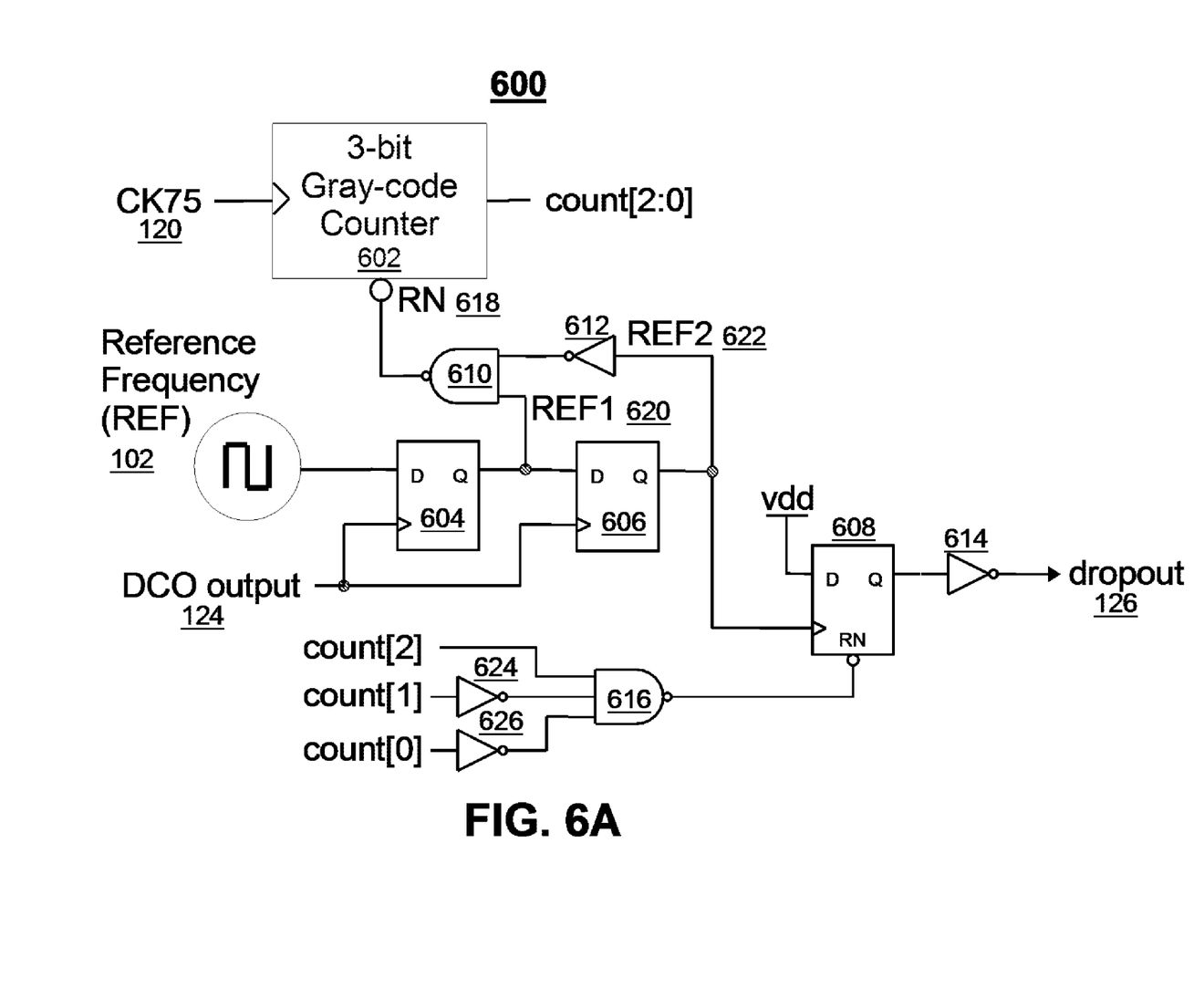
FIG. 6A illustrates a digital circuit schematic of a dropout detector, in an accordance with a described implementation.

FIG. 6A is a schematic 600 of the dropout detector 104 illustrating measuring of whether the reference frequency 102 goes away. The dropout detector 104 generates the dropout 126 based on the reference frequency 102 and the CK75 signal 120 received from the output divider 114. The generated dropout signal 126 is passed to the digital frequency iteration engine 106. In some applications such as music synthesizers, the reference frequency (e.g., the reference frequency 102) may go away (e.g., if the music stops playing), and the dropout 126 would reflect that.

Figure 6B:
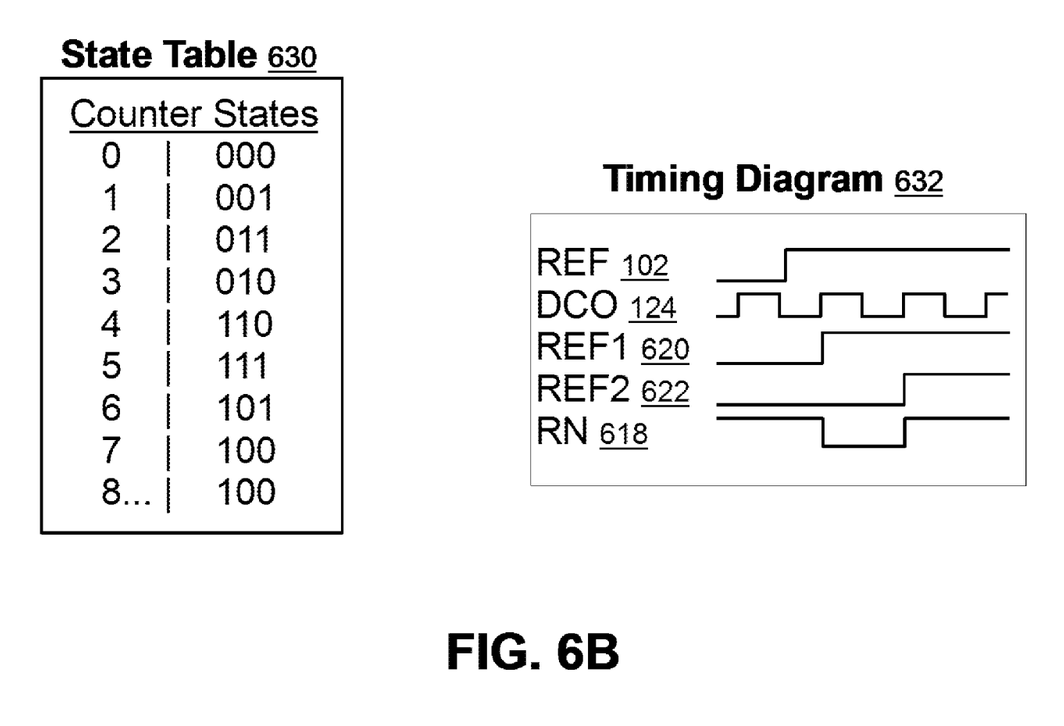
FIG. 6B illustrates a state table and a timing diagram associated with the dropout detector, in an accordance with a described implementation.

FIG. 6B contains a state table 630 illustrating the state transitions that take place in the dropout detector 104 and a timing diagram 632 illustrating some key signals present in the dropout detector 104. The state table 630 illustrates the states that the dropout detector 104 goes through as the 3-bit Gray-code counter 602 is clocked. As the 3-bit Gray-code counter 602 runs, only one bit changes in each of the transitions. As shown in FIG. 6A, the CK75 signal 120 generated by the output divider 114 is passed to the 3-bit Gray-code counter 602 of the "dropout" detector 104. Each positive edge of the CK75 signal 120 increments the 3-bit Gray code counter 602, which is reset whenever a positive edge is detected on the reference frequency 102 clock input via the D flip-flops 604 and 606, an inverter gate 612, and a logic NAND gate 610.

In particular, the logic NAND gate 610 and the flip-flops 604 and 606 generate a short negative pulse 618 that resets the 3-bit Gray-code counter 602. First, the flip-flop 604 receives the reference frequency 102 and the DCO output 124. If a reference clock edge occurs, the reference frequency 102 gets delayed by the DCO output 124 (the DCO is running faster). First, the reference frequency 102 goes through the flip-flop 604, which creates a first delay. Then, the flip-flop 606 creates another delayed version.

If a positive edge occurs on the reference frequency 102, the 3-bit Gray-code counter 602 is reset and the state machine 600 goes back to state zero, and the 3-bit Gray-code counter 602 starts counting again. If the reference frequency 102 edges occur frequently enough, the 3-bit Gray-code counter 602 never reaches the state of seven, and, as a result, the dropout signal 126 stays low. When the 3-bit Gray-code counter 602 reaches a count of seven, the state is seven, which drives reset input of the flip-flop 608 low. As a result, this forces the "Q" of the flip-flop 608 low, and then the inverter 614 inverts the output of the flip-flop 608, resulting in a high dropout 126.

As shown in FIG. 6B, the states table 630 illustrates the states that the 3-bit Gray-code counter 602 goes through in order from zero to seven, illustrating the property that only one bit is allowed to change on a state transition. When the count is more than seven, the counter output remains in the 100 state.

In some implementations, when the 3-bit Gray-code counter 602 reaches the final code 100, before a positive edge occurs on the reference clock 102, the circuit 600 determines that the reference signal 102 has "dropped out." The active-low reset input of the D flip-flop 608 is driven low, forcing its output low, and the "dropout" signal 126 is driven high. In some embodiments, this may take between 80 ms and 160 ms, corresponding to 8 cycles of a 50-100 Hz signal. This time may be set sufficiently long such that any signal oscillating periodically at a rate corresponding to the minimum possible dropout time (e.g., 80 ms) is guaranteed to be below the minimum frequency of the DCO 110. Given that the CK75 signal 120 and the reference clock signal 102 are asynchronous to each other, Gray-coding may be utilized for the counter 602 in the dropout detector 104 to prevent the dropout logic to inadvertently trigger because of counter bits passing temporarily through an out-of-order state.

When the dropout detector 104 detects that the reference signal 102 has dropped out, the digital frequency iteration engine 106 is informed, so that when the reference signal 102 returns, it will calculate the new period based on the next two reference edges rather than using a stale reference edge from before the reference signal 102 dropped out. Because the DCO control signal is digital, if the reference signal drops out it may continue to oscillate at the last frequency locked indefinitely.

FIG. 6B illustrates a timing diagram 632 of signals 102, 120, 618, 620, and 622. As shown, the DCO signal 124 is faster than the reference frequency signal 102. The signal 620 is a delayed version of the reference frequency 102, with the delay provided by the flip-flop 604. The signal 622 is a delayed version of the signal 620, with the delay provided by the flip-flop 606. Accordingly, the signals 620 and 622 are delayed versions of the reference frequency 102. The signal 618 is produced by the logic NAND gate 610 and the inverter 612 using the signals 620 and 622 as shown in FIG. 6A. In particular, the logic NAND gate 610 takes as input the signal 620 and output of the inverter 612 (which in turn receives signal 622 as input), and produces the signal 618, which is used to reset the counter 602.

Figure 7:
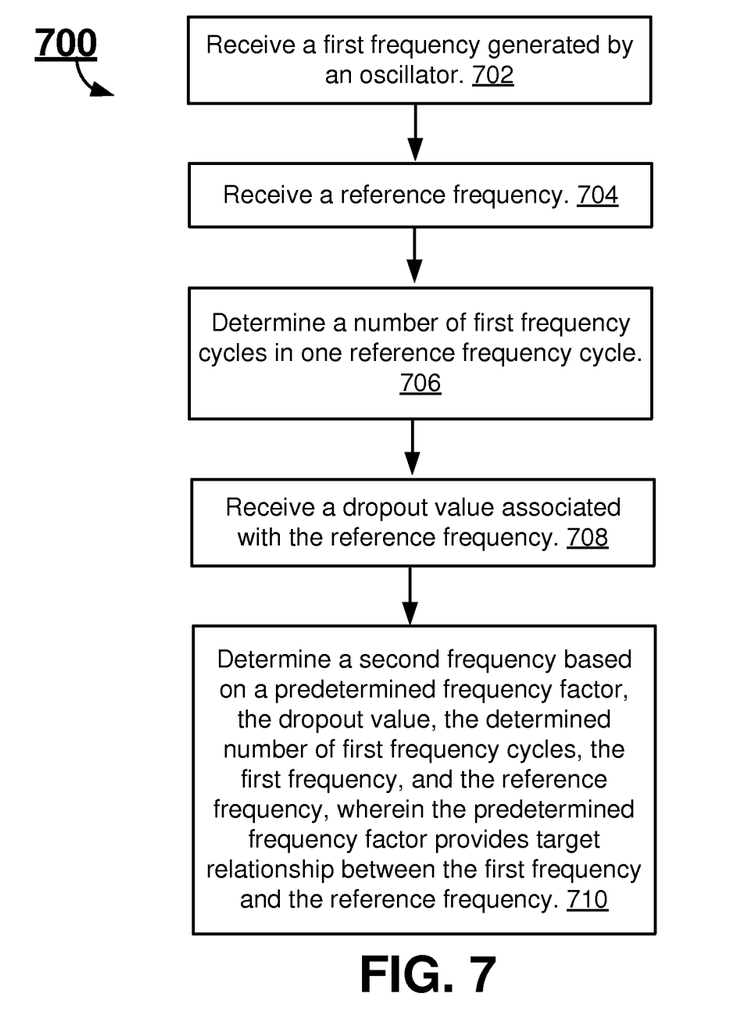
FIG. 7 is a flow diagram of a process for determining a frequency, in accordance with a described implementation.

FIG. 7 is a flow diagram of a process 700 for determining a new frequency using a frequency generated by an oscillator and a reference frequency. The process 700 can be implemented by the digital frequency iteration engine 106, or by one or more other components of a frequency-locked loop circuit 100.

At block 702, a first frequency is received. The first frequency may be received from an oscillator that generated the first frequency. The oscillator may be a digitally controlled oscillator. FIG. 2 provides an example block diagram of an oscillator that generates the first frequency.

A reference frequency is received (block 704). The reference frequency may be dynamic and change over a multi-decade range of frequencies. An oscillator different from the oscillator that generated the first frequency may generate the reference frequency.

A number of first frequency cycles in one reference frequency cycle is determined (block 606). FIG. 3 illustrates one implementation of determining the number of first frequency cycles that utilizes a Gray-code counter, a Gray-to-binary converter, two banks of flip-flops, and a subtractor block. The output of the subtractor block (shown as the block 314 in FIG. 3) provides the number of first frequency cycles in one reference frequency cycle.

At block 708, a dropout value associated with the reference frequency is received. The dropout value may be received from a dropout detector (e.g., the dropout detector 104). In one implementation, the dropout value may be calculated by the dropout detector as shown in FIG. 6A.

A second frequency is determined (block 710) based on a predetermined frequency factor, the dropout value, the determined number of first frequency cycles, the first frequency, and the reference frequency. In one embodiment, the second frequency may be calculated by performing a piecewise-linear logarithm calculation based on the predetermined frequency factor and the first input value determined by a multiplexor. The piecewise-linear logarithm calculation may involve estimating value of 16 $\log_2$ (the first input value/the predetermined frequency factor).

The predetermined frequency factor may provide target relationship between the first frequency and the reference frequency. In some embodiments, a target frequency may be a result of multiplying the reference frequency by the predetermined frequency factor. In these embodiments, it may be desirable to get the first frequency closer to the target frequency. In one implementation, the predetermined frequency factor may have a value of 8,192.

Determining the second frequency may involve a multiplexor determining a first input value based on the predetermined frequency factor, the dropout value, and the number of cycles, where the multiplexor receives the number of cycles and the predetermined frequency factor as inputs, and the dropout value as the selection input. When the dropout value indicates that the signal of the reference frequency is not available, the multiplexor may assign the predetermined frequency factor to the multiplexor output, and if the dropout value indicates that the signal of the reference frequency is available, the multiplexor may assign the number of cycles to the multiplexor output.

Those skilled in the art would appreciate that the circuits described herein may be realized using a variety of transistor types. Various transistor types can be used including bipolar junction transistors, junction field effect transistor, etc. The circuits described herein may be fabricated with various IC process technologies (e.g., CMOS, silicon germanium, bipolar junction transistor, bipolar-CMOS, etc.).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein. For example, many circuits are possible for implementing the digital frequency iteration engine 106, the dropout detector 104, the DCO 110, the output divider 114, the sigma-delta modulator 112, and the FLL circuit 100. These systems may be implemented with analog electronics, digital logic, software executing on a processor, or any combination of these or other techniques.

What is claimed is:

1. A method for generating frequencies in a music synthesizer, the method comprising:
   receiving a first frequency generated by an oscillator;
   receiving a reference frequency;
   determining a number of first frequency cycles in one reference frequency cycle; and
   determining a second frequency based on a predetermined frequency multiplication factor, the determined number of first frequency cycles, the first frequency, and the reference frequency, wherein the predetermined multiplication factor provides target relationship between the first frequency and the reference frequency, wherein determining the second frequency comprises determining a first input value based on the predetermined frequency multiplication factor, the dropout value, and the number of cycles; and performing a piecewise-linear logarithm calculation based on the predetermined frequency multiplication factor and the first input value.

2. The method of claim 1, wherein the piecewise-linear logarithm calculation includes estimating value of (a multiplication factor)*log 2 (the first input value/the predetermined frequency multiplication factor).

3. The method of claim 1, wherein the first input value is an output from a multiplexor, the multiplexor configured to receive the number of cycles and the predetermined frequency multiplication factor as inputs, and the dropout value as the selection input.

4. The method of claim 3, wherein if the dropout value indicates that the signal of the reference frequency is not available, the multiplexor assigning the predetermined frequency multiplication factor to the multiplexor output, and if the dropout value indicates that the signal of the reference frequency is available, the multiplexor assigning the number of cycles to the multiplexor output.

5. A frequency-locked loop circuit comprising:
   a digitally controlled oscillator configured to generate a first frequency;
   a dropout detector configured to receive a reference frequency, and generate a dropout value; and
   a digital frequency iteration engine comprising:
      a first circuit configured to receive the first frequency and the reference frequency, and generate a number of first frequency cycles in one reference frequency cycle; and
      a second circuit configured to receive the number of first frequency cycles, and generate a second frequency based on a predetermined frequency multiplication factor, the dropout value, the determined number of first frequency cycles, the first frequency, and the reference frequency, wherein the predetermined frequency multiplication factor provides a target relationship between the first frequency and the reference frequency, and wherein a divider is configured to receive the first frequency from the digitally controlled oscillator, generate a third frequency, and transmit the third frequency to the dropout detector.

6. The frequency-locked loop circuit of claim 5, wherein the dropout detector determines the dropout value based on the third frequency and the reference frequency.

7. The frequency-locked loop circuit of claim 6, wherein the dropout detector comprising a Gray-code counter, with each positive edge of the third frequency incrementing the Gray-code counter, and wherein the Gray-Code counter is reset on a positive edge of the reference frequency.

8. A frequency-locked loop circuit comprising:
a digitally controlled oscillator configured to generate a first frequency; and
a digital frequency iteration engine comprising:
a first circuit configured to receive the first frequency and a reference frequency, and generate a number of first frequency cycles in one reference frequency cycle; and
a second circuit configured to receive the number of first frequency cycles, and generate a second frequency based on a predetermined frequency multiplication factor, the determined number of first frequency cycles, the first frequency, and the reference frequency, wherein the predetermined frequency multiplication factor provides a target relationship between the first frequency and the reference frequency, and
a counter configured to receive the reference frequency and the first frequency, the counter coupled to the digital frequency iteration engine.

9. The frequency-locked loop circuit of claim 8, further comprising a sigma-delta modulator, and an adder block configured to receive output from the sigma-delta modulator and the second frequency generated by the digital frequency iteration engine, and perform a calculation on the sigma-delta modulator output and the second frequency, and transmit a result of the calculation to the digitally controlled oscillator.

10. The frequency-locked loop circuit of claim 8, wherein the first circuit comprising a Gray-code counter, a gray to binary converter, and one or more flip-flops.

11. The frequency-locked loop circuit of claim 8, wherein the second circuit comprising a multiplexor, an estimation module, and one or more flip-flops.

12. The frequency-locked loop circuit of claim 11, wherein the multiplexor is configured to receive the number of cycles and the predetermined frequency multiplication factor as inputs, and the dropout value as the selection input.

13. The frequency-locked loop circuit of claim 11, wherein the estimation module is configured to perform a piecewise-linear logarithmic calculation.

14. A frequency synthesizer comprising:
a frequency-locked loop circuit comprising:
a digitally controlled oscillator configured to generate a first frequency;
a dropout detector configured to receive a reference frequency and a first frequency, and generate a dropout value; and
a digital frequency iteration engine comprising:
a first circuit comprising a Gray-code counter, a Gray-to-binary converter, a first plurality of flip-flops, the first circuit configured to receive the first frequency and a reference frequency, and generate a number of first frequency cycles in one reference frequency cycle; and
a second circuit comprising a multiplexor, a second plurality of flip-flops, and an estimation module, the second circuit configured to receive the number of first frequency cycles, and generate a second frequency based on a predetermined frequency multiplication factor, the dropout value, the determined number of first frequency cycles, the first frequency, and the reference frequency, wherein the predetermined frequency multiplication factor provides a target relationship between the first frequency and the reference frequency.

* * * * *